US011947249B2

(12) United States Patent
Noda et al.

(10) Patent No.: US 11,947,249 B2
(45) Date of Patent: Apr. 2, 2024

(54) LIGHT EMITTING APPARATUS, METHOD FOR MANUFACTURING LIGHT EMITTING APPARATUS, AND PROJECTOR

(71) Applicant: Seiko Epson Corporation, Tokyo (JP)

(72) Inventors: Takafumi Noda, Matsumoto (JP); Hideki Hahiro, Yamagata (JP); Tetsuji Fujita, Chino (JP); Atsushi Ito, Shimosuwa (JP); Koichiro Akasaka, Shinjuku (JP); Yasutaka Imai, Suwa (JP); Michifumi Nagawa, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 226 days.

(21) Appl. No.: 17/481,564

(22) Filed: Sep. 22, 2021

(65) Prior Publication Data
US 2022/0093827 A1    Mar. 24, 2022

(30) Foreign Application Priority Data

Sep. 23, 2020 (JP) ................... 2020-158805

(51) Int. Cl.
G03B 21/20 (2006.01)
H01L 33/00 (2010.01)
H01L 33/10 (2010.01)
H01L 33/18 (2010.01)
H01L 33/24 (2010.01)

(52) U.S. Cl.
CPC ...... *G03B 21/2033* (2013.01); *H01L 33/0025* (2013.01); *H01L 33/10* (2013.01); *H01L 33/18* (2013.01); *H01L 33/24* (2013.01); *H01L 33/0075* (2013.01)

(58) Field of Classification Search
CPC . H01L 33/24; H01L 33/0025; H01L 33/0075; H01L 33/10; H01L 33/18; H01L 33/08; H01L 33/16; H01L 33/12; H01L 33/20; H01L 33/32; G03B 21/2033
See application file for complete search history.

(56) References Cited

U.S. PATENT DOCUMENTS

| 6,682,991 B1 | 1/2004 | Hino et al. |
| 2002/0043208 A1 | 4/2002 | Biwa et al. |
| 2005/0042787 A1 | 2/2005 | Ito et al. |
| 2008/0197766 A1 | 8/2008 | Goislard de Monsabert et al. |
| 2011/0227116 A1 | 9/2011 | Saito et al. |
| 2011/0303924 A1* | 12/2011 | Mochizuki ......... G03B 21/2033 257/E33.025 |

(Continued)

FOREIGN PATENT DOCUMENTS

| JP | H10-242577 A | 9/1998 |
| JP | 2002-033288 A | 1/2002 |

(Continued)

Primary Examiner — Magda Cruz
(74) Attorney, Agent, or Firm — Harness, Dickey & Pierce, P.L.C.

(57) ABSTRACT

A light emitting apparatus according to the present disclosure includes a first layer made of a semiconductor monocrystal, a second layer provided at the first layer and having a crystal orientation not continuous with the crystal orientation of the first layer, and a columnar crystal structure including a light emitting layer and extending from the second layer.

13 Claims, 3 Drawing Sheets

(56) References Cited

U.S. PATENT DOCUMENTS

| | | | |
|---|---|---|---|
| 2017/0047477 A1* | 2/2017 | Hyot | H01L 33/0075 |
| 2017/0110624 A1* | 4/2017 | Kuraoka | H01L 33/16 |
| 2020/0035860 A1* | 1/2020 | Michiue | H01L 33/24 |
| 2020/0041889 A1* | 2/2020 | Ishizawa | H01S 5/18319 |
| 2020/0313032 A1* | 10/2020 | Imai | H01L 33/0004 |
| 2021/0168338 A1* | 6/2021 | Itoh | H01S 5/11 |
| 2021/0408765 A1* | 12/2021 | Ishizawa | H01S 5/1042 |

FOREIGN PATENT DOCUMENTS

| | | |
|---|---|---|
| JP | 2003-133649 A | 5/2003 |
| JP | 2003-289047 A | 10/2003 |
| JP | 2008-546146 A | 12/2008 |
| JP | 2015-226021 A | 12/2015 |
| WO | 2010-055750 A1 | 5/2010 |

\* cited by examiner

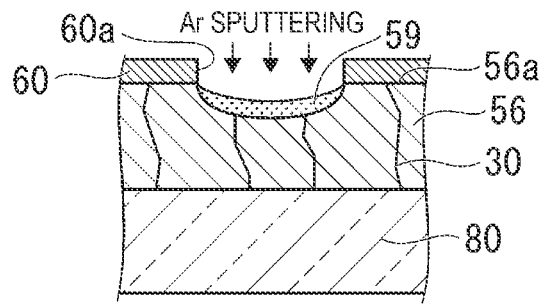
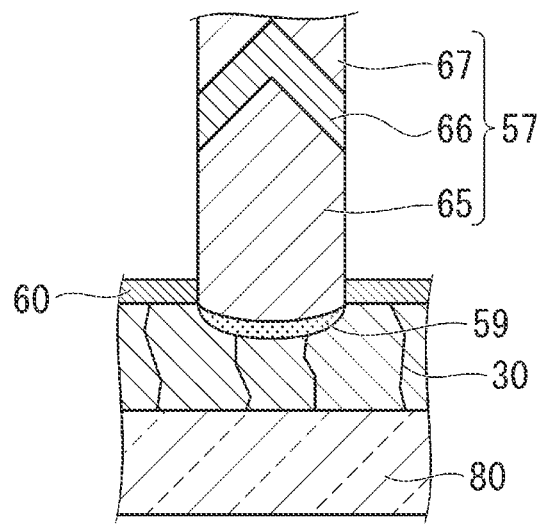
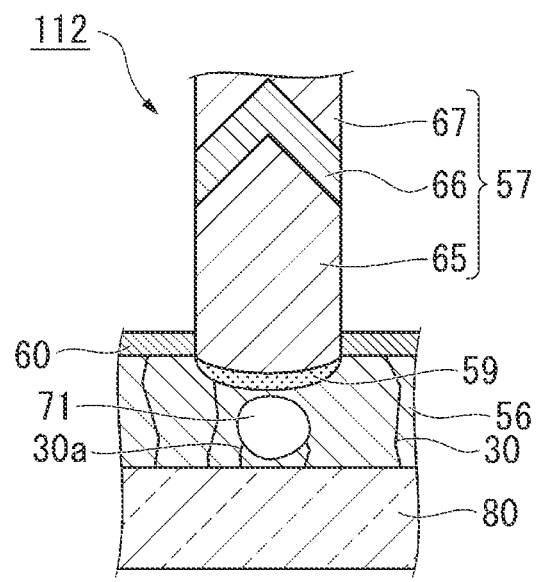

LIGHT EMITTING APPARATUS, METHOD FOR MANUFACTURING LIGHT EMITTING APPARATUS, AND PROJECTOR

The present application is based on, and claims priority from JP Application Serial Number 2020-158805, filed Sep. 23, 2020, the disclosure of which is hereby incorporated by reference herein in its entirety.

BACKGROUND

1. Technical Field

The present disclosure relates to a light emitting apparatus, a method for manufacturing the light emitting apparatus, and a projector.

2. Related Art

There has been a crystal growth method for forming a mask layer on a first nitride semiconductor layer and then forming a second nitride semiconductor layer by using crystal growth in an opening of the mask layer (see, for example, JP-A-2002-33288). In the crystal growth method described above, irregularities are provided at a surface of the first nitride semiconductor layer that is the surface facing the space in the opening to prevent the propagation of threading dislocations into the second nitride semiconductor layer.

The crystal growth method described above, however, cannot sufficiently prevent the propagation of threading dislocations into the second nitride semiconductor layer because the irregularities have a relatively large height difference greater than or equal to 30 nm. Therefore, when the crystal growth method described above is used to form light-emitting-layer containing nanocolumns of a light emitting apparatus, the propagation of threading dislocations into the light emitting layers undesirably results in a decrease in light emission efficiency.

SUMMARY

To solve the problem described above, according to an aspect of the present disclosure, there is provided a light emitting apparatus including a first layer made of a semiconductor monocrystal, a second layer provided at the first layer and having a crystal orientation not continuous with a crystal orientation of the first layer, and a columnar crystal structure including a light emitting layer and extending from the second layer.

According to another aspect of the present disclosure, there is provided a method for manufacturing a light emitting apparatus including forming a first layer made of a semiconductor monocrystal at a support substrate, forming a mask layer having a through hole at one surface of the first layer, forming a second layer having a crystal orientation not continuous with a crystal orientation of the first layer at the first layer located in the through hole, and forming a columnar crystal structure including a light emitting layer on the second layer by using crystal growth.

According to another aspect of the present disclosure, there is provided a projector including the light emitting apparatus according to the aspect of the present disclosure.

BRIEF DESCRIPTION OF THE DRAWINGS

FIG. 4C shows the process of manufacturing the nanocolumn.

FIG. 4D shows the process of manufacturing the nanocolumn.

FIG. 5 is an enlarged view of key parts of the nanocolumn in the light emitting apparatus according to a second embodiment.

DESCRIPTION OF EXEMPLARY EMBODIMENTS

First Embodiment

A first embodiment according to the present disclosure will be described below with reference to the drawings.

Figure 1:
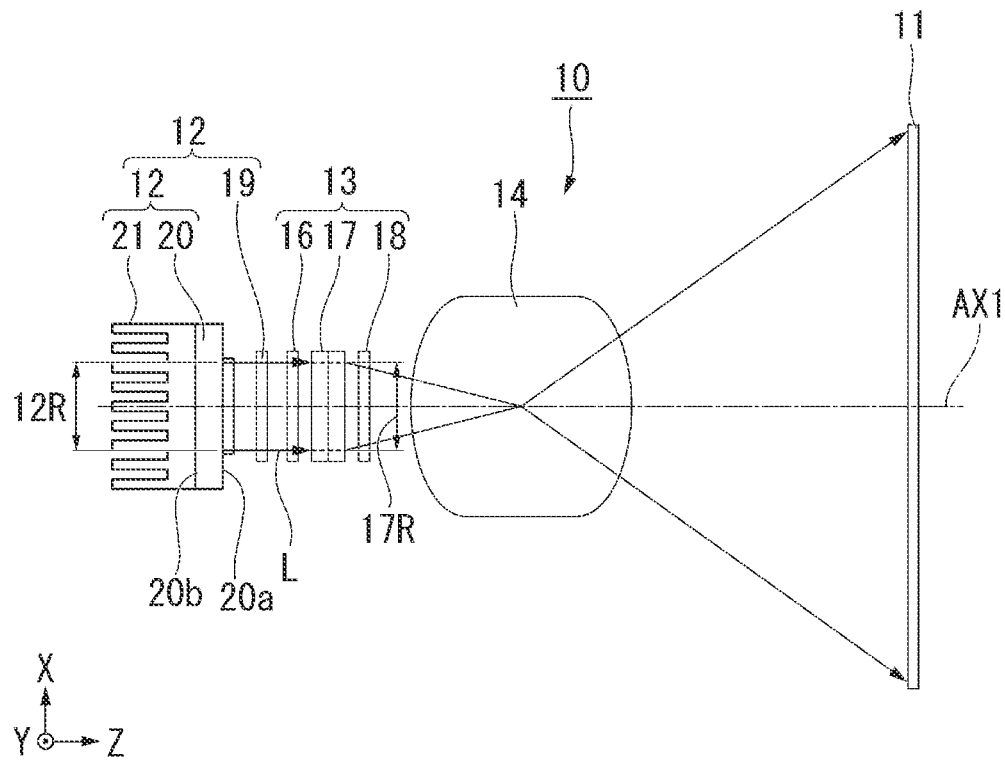
FIG. 1 is a schematic configuration diagram of a projector according to a first embodiment.

FIG. 1 is a schematic configuration diagram of a projector according to the present embodiment.

In the following drawings, components are drawn at different dimensional scales in some cases for clarification of each of the components.

A projector 10 according to the present embodiment is a projection-type image display apparatus that displays an image on a screen 11, as shown in FIG. 1. The projector 10 includes a light emitting apparatus 12, a light modulation apparatus 13, and a projection optical apparatus 14. The configuration of the light emitting apparatus 12 will be described later in detail.

An optical axis along which the chief ray of a luminous flux L outputted via a light emitting region 12R of the light emitting apparatus 12 extends and which is the axis that coincides with a normal passing through the center of the light emitting region 12R is hereinafter referred to as an optical axis AX1.

The configuration of each portion of the projector will be described below by using an XYZ orthogonal coordinate system. Axes used in the description are defined as follows: an axis X is an axis parallel to the long sides of the light emitting region 12R, which has a rectangular planar shape when viewed in the direction of the optical axis AX1; an axis Y is an axis parallel to the short sides of the light emitting region; and an axis Z is an axis perpendicular to the axes X and Y. The axis Z is parallel to the optical axis AX1.

The light modulation apparatus 13 modulates the luminous flux L emitted from the light emitting apparatus 12 in accordance with image information to generate image light. The light modulation apparatus 13 includes a light-incident-side polarizer 16, a liquid crystal display device 17, and a light-exiting-side polarizer 18. An image formation region 17R of the liquid crystal display device 17 has a rectangular planar shape when viewed in the axis-Z direction. The light emitting region 12R of the light emitting apparatus 12 has a rectangular planar shape, as described above, and the planar shape of the image formation region 17R is substantially similar to the planar shape of the light emitting region 12R. The area of the light emitting region 12R is equal to or slightly greater than the area of the image formation region 17R.

The projection optical apparatus 14 projects the image light outputted from the light modulation apparatus 13 onto a projection receiving surface, such as the screen 11. The projection optical apparatus 14 is formed of a single projection lens or a plurality of projection lenses.

The light emitting apparatus 12 according to the present embodiment will be described below.

The light emitting apparatus 12 includes a light emitting device 20 and a heat sink 21, as shown in FIG. 1. The light emitting device 20 has a first surface 20a and a second surface 20b and emits the luminous flux L via the first surface 20a. The heat sink 21 is provided at the second surface 20b of the light emitting device 20 to dissipate heat generated by the light emitting device 20.

Figure 2:
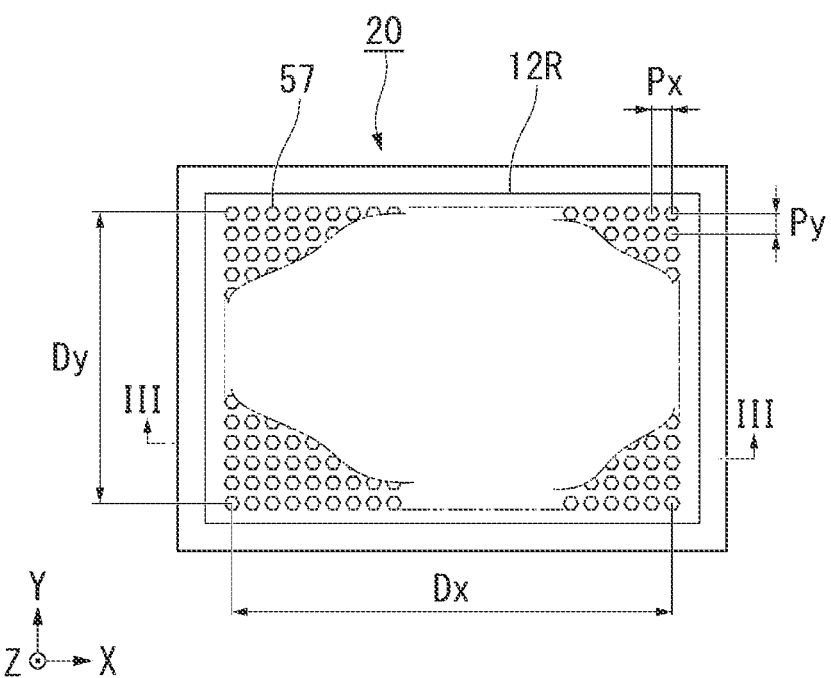
FIG. 2 is a plan view showing a schematic configuration of a light emitting device.
Figure 3:
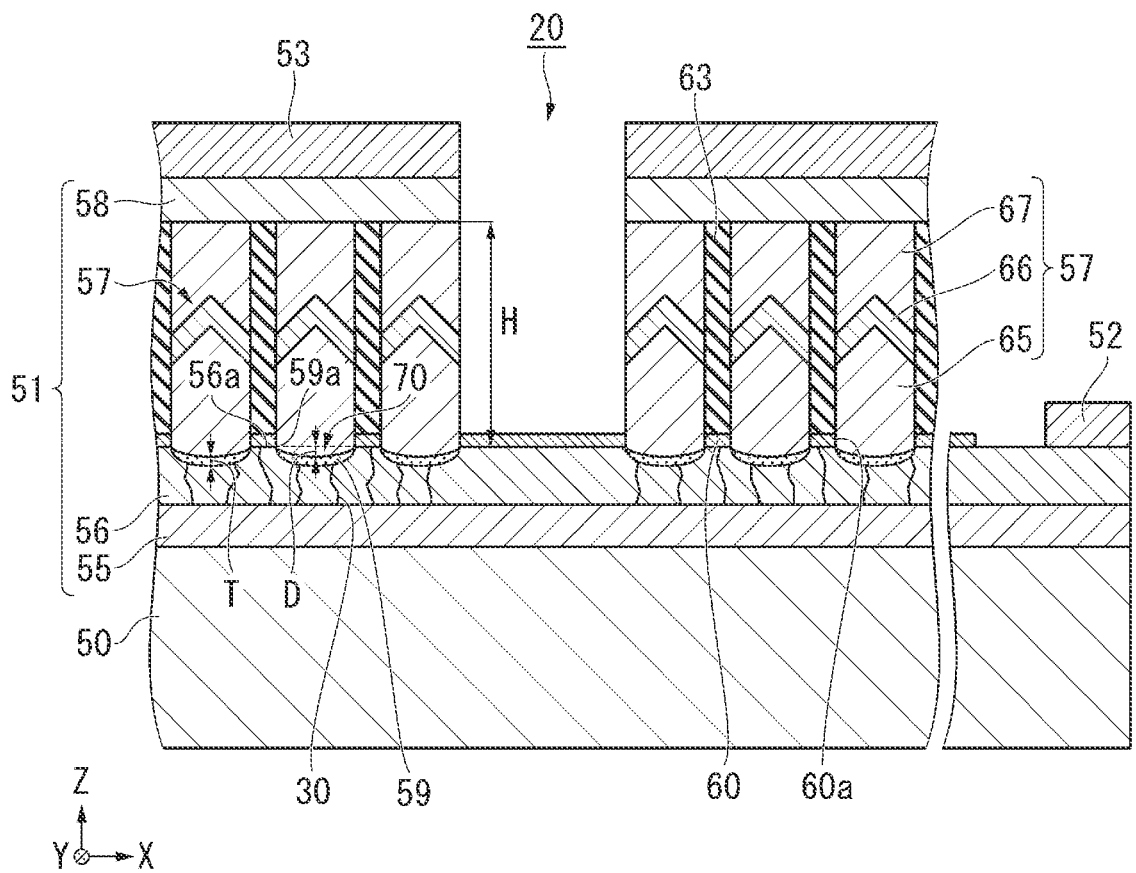
FIG. 3 is a cross-sectional view of the light emitting device taken along the line III-III in FIG. 2.

FIG. 2 is a plan view showing a schematic configuration of the light emitting device 20. FIG. 3 is a cross-sectional view of the light emitting device 20 taken along the line III-III in FIG. 2. In FIG. 2, only part of nanocolumns 57 in the light emitting region 12R is shown, and the other nanocolumns 57 are omitted for clarity of illustration.

The light emitting device 20 includes a substrate 50, a laminate 51, a first electrode 52, and second electrodes 53, as shown in FIG. 3. The laminate 51 includes a reflection layer 55, a buffer layer 56, the nanocolumns 57, and a third semiconductor layer 58.

The substrate 50 is formed, for example, of a silicon (Si) substrate, a gallium nitride (GaN) substrate, or a sapphire substrate.

The reflection layer 55 is provided on the substrate 50. The reflection layer 55 is formed, for example, of a distribution Bragg reflector (DBR) layer. The reflection layer 55 is formed, for example, of a laminate in which AlGaN layers and GaN layers are alternately laminated on each other or a laminate in which AlInN layers and GaN layers are alternately laminated on each other. The reflection layer 55 reflects light generated by light emitting layers 66, which will be described below, in the nanocolumns 57 toward the second electrodes 53.

The present specification will be described on the assumption that in the axis-Z direction, which is the lamination direction of the laminate 51, the direction from the light emitting layers 66 as a reference toward a second semiconductor layer 67 is called "upper", and the direction from the light emitting layers 66 as the reference toward first semiconductor layers 65 is called "lower". Further, the "lamination direction of the laminate 51" is the direction in which the first semiconductor layer 65 and the light emitting layers 66 face each other and may be simply referred to as a "lamination direction" below.

The buffer layer 56 is provided on the reflection layer 55. The buffer layer 56 is made of a semiconductor material and formed, for example, of an n-type GaN layer into which Si has been doped. In the present embodiment, the buffer layer 56 corresponds to the "first layer" in the appended claims.

The buffer layer 56 is a single crystal semiconductor layer formed by epitaxial growth on a support substrate, such as a sapphire substrate, as will be described later. The buffer layer 56 therefore has threading dislocation defects 30 starting from the interface between the buffer layer 56 and the support substrate due, for example, to lattice mismatch and thermal expansion coefficient mismatch between the buffer layer 56 and the support substrate.

A mask layer 60 is provided on one surface 56a of the buffer layer 56, as shown in FIG. 3, and used to grow a film that forms the nanocolumns 57, which will be described later, in the step of manufacturing the light emitting device 20. The mask layer 60 is formed, for example, of a silicon oxide layer or a silicon nitride layer. In the present embodiment, the light emitting device 20 includes the mask layer 60, but not necessarily. After the nanocolumns 57 are formed in the step of manufacturing the light emitting device 20, the mask layer 60 may be removed, for example, by using wet etching.

The mask layer 60 is provided with a plurality of through holes 60a. The plurality of through holes 60a each expose the buffer layer 56, which is provided below the mask layer 60. A defect dislocation prevention layer 59 is provided at the surface of the buffer layer 56 located in each of the through holes 60a. The defect dislocation prevention layers 59 are formed by roughening the surface of the buffer layer 56, which is made of a single crystal, for example, by Ar sputtering. The defect dislocation prevention layers 59 correspond to the "second layer" in the appended claims.

The defect dislocation prevention layers 59 are each provided over the entire region of the opening of the corresponding through hole 60a. In the present embodiment, the defect dislocation prevention layers 59 are each, for example, a layer in which point defects locally gather or a layer having random crystal orientations. The defect dislocation prevention layers 59 are each a layer having an island-shaped single crystal surface.

The defect dislocation prevention layers 59 are each formed of a layer having a defect level ranging from a point defect level to a collective defect level that does not result in a lattice dislocation defect, that is, a defect density level that does not affect the epitaxial growth of the nanocolumns 57 but can block the threading dislocation defects 30.

The thus configured defect dislocation prevention layers 59 each have a crystal orientation that is not continuous with that of the buffer layer 56.

In the present embodiment, the defect dislocation prevention layers 59 are each provided in a position recessed from the one surface 56a of the buffer layer 56. A recess 70, where each of the defect dislocation prevention layers 59 is provided, has a depth D set at a value ranging from 0 to 30 nm, more desirably a value smaller than or equal to 20 nm. The depth D of the recess 70 is specified, for example, by the height difference between the one surface 56a of the buffer layer 56 and the bottom surface of the recess 70.

In the present embodiment, the defect dislocation prevention layers 59 each have a thickness T set at 5 nm or smaller. The surface roughness of the defect dislocation prevention layers 59 is set, for example, at a few nanometers. The surface roughness of the defect dislocation prevention layers 59 is specified by the height difference of the minute irregularities formed at the surface of the buffer layer 56.

The nanocolumns 57 are each a columnar crystal structure extending from the defect dislocation prevention layer 59. That is, the nanocolumns 57 extend from the defect dislocation prevention layer 59 through the through holes 60a. In a plan view along the direction in which the nanocolumns 57 extend (direction Z), the nanocolumns 57 are positioned so as to overlap with the defect dislocation prevention layers 59. The defect dislocation prevention layers 59 can thus efficiently block the propagation of the threading dislocation defects 30 into the nanocolumns 57, as will be described later.

In the present embodiment, the nanocolumns 57 correspond to the "columnar crystal structure" in the appended claims.

The nanocolumns 57 can provide a photonic crystal effect, which traps the light emitted by the light emitting layers 66 in the in-plane direction of the substrate 50 and outputs the light in the lamination direction. The "in-plane direction of the substrate 50" is the direction along the plane perpendicular to the lamination direction.

The nanocolumns 57 each have, for example, a polygonal, circular, or elliptical planar shape. In the present embodiment, the nanocolumns 57 each have a regular hexagonal planar shape, as shown in FIG. 2. The nanocolumns 57 each have a diameter in the order of nanometers, specifically, for example, greater than or equal to 10 nm but smaller than or equal to 500 nm. The dimension of the nanocolumns 57 in the lamination direction, what is called a height H of the nanocolumns 57, is, for example, greater than or equal to 0.1 μm but smaller than or equal to 5 μm.

In a case where the nanocolumns 57 each have a circular planar shape, the term "the diameter of the nanocolumns 57" refers to the diameter of the circular shape, and when the nanocolumns 57 each have a non-circular planar shape, the term refers to the diameter of a minimum circle containing the non-circular shape therein. For example, when the nanocolumns 57 each have a polygonal planar shape, the diameter of the nanocolumns 57 refers to the diameter of a minimum circle containing the polygonal shape therein, and when the nanocolumns 57 each have an elliptical planar shape, the diameter of the nanocolumns 57 refers to the diameter of a minimum circle containing the elliptical shape therein.

In a case where the nanocolumns 57 each have a circular planar shape, the term "the center of each of the nanocolumns 57" refers to the center of the circular shape, and when the nanocolumns 57 each have a non-circular planar shape, the term refers to the center of a minimum circle containing the non-circular shape therein. For example, when the nanocolumns 57 each have a polygonal planar shape, the center of each of the nanocolumns 57 refers to the center of a minimum circle containing the polygonal shape therein, and when the nanocolumns 57 each have an elliptical planar shape, the center of each of the nanocolumns 57 refers to the center of a minimum circle containing the elliptical shape therein.

The plurality of nanocolumns 57 are arranged in a square lattice on the buffer layer 56 as shown in FIG. 2. Intervals Px and Py between two adjacent nanocolumns 57 are each, for example, greater than or equal to 1 nm but smaller than or equal to 500 nm. In the present embodiment, the interval Px in the axis-X direction and the interval Py in the axis-Y direction are equal to each other. The plurality of nanocolumns 57 are thus periodically arranged at predetermined intervals Px and Py along the axis-X and axis-Y directions perpendicular to each other. The interval Px in the axis-X direction is the distance between the centers of two nanocolumns 57 adjacent to each other in the axis-X direction. The interval Py in the axis-Y direction is the distance between the centers of two nanocolumns 57 adjacent to each other in the axis-Y direction. The plurality of nanocolumns 57 are not necessarily arranged in a square lattice and may be arranged, for example, in an oblong lattice or a triangular lattice.

The nanocolumns 57 each have the first semiconductor layer 65, the light emitting layer 66, and the second semiconductor layer 67 as shown in FIG. 3. The layers that form each of the nanocolumns 57 are each formed by epitaxial growth, as will be described later.

The first semiconductor layer 65 is formed on the defect dislocation prevention layer 59 provided at the surface of the buffer layer 56. The first semiconductor layer 65 is formed, for example, of an n-type GaN layer to which Si has been doped. In the present embodiment, the first semiconductor layer 65 is made of the same material as that of the buffer layer 56. The defect dislocation prevention layer 59 suppresses or prevents propagation of the threading dislocation defects 30 into the first semiconductor layer 65.

The light emitting layer 66 is provided on the first semiconductor layer 65. The light emitting layer 66 is provided between the first semiconductor layer 65 and the second semiconductor layer 67. The light emitting layer 66 has a quantum well structure formed, for example, of a GaN layer and an InGaN layer. The light emitting layer 66 emits light when an electric current is injected thereinto via the first semiconductor layer 65 and the second semiconductor layer 67. Since the propagation of the threading dislocation defects 30 into the first semiconductor layer 65 is suppressed or prevented as described above, no threading dislocation defects 30 are formed in the light emitting layer 66 formed on the first semiconductor layer 65.

The second semiconductor layer 67 is provided on the light emitting layer 66. The second semiconductor layer 67 differs from the first semiconductor layers 65 in terms of conductivity type. The second semiconductor layer 67 is formed, for example, of a p-type GaN layer to which Mg has been doped. The first semiconductor layers 65 and the second semiconductor layer 67 each function as a cladding layer having the function of confining the light in the light emitting layer 66. Since no threading dislocation defects 30 are formed in the lower light emitting layer 66 as described above, no threading dislocation defects 30 are formed in the second semiconductor layer 67.

As described above, the nanocolumns 57 in the present embodiment are formed on the defect dislocation prevention layers 59 to prevent formation of the threading dislocation defects 30 at least in the light emitting layer 66.

A light propagation layer 63 is provided between adjacent nanocolumns 57. In the example shown in FIG. 3, the light propagation layer 63 is provided on the mask layer 60. The refractive index of the light propagation layer 63 is smaller than the refractive index of the light emitting layer 66. The light propagation layer 63 is formed, for example, of a silicon oxide layer, an aluminum oxide layer, or a titanium oxide layer. The light generated in the light emitting layer 66 propagates through the light propagation layer 63.

In the light emitting device 20, the laminate of the p-type second semiconductor layer 67, the light emitting layer 66, into which no impurity has been doped, and the n-type first semiconductor layer 65 forms a pin diode. The bandgap of each of the first semiconductor layer 65 and the second semiconductor layer 67 is wider than the bandgap of the light emitting layer 66. When a forward bias voltage for the pin diode is applied to the space between the first electrode 52 and the second electrodes 53 so that a current is injected into the pin diode, electrons and holes recombine with each other in the light emitting layer 66, followed by light emission.

The first semiconductor layer 65 and the second semiconductor layer 67 cause the light generated in the light emitting layer 66 to propagate through the light propagation layer 63 in the in-plane direction of the substrate 50. In this process, the photonic crystal effect provided by the nanocolumns 57 causes the light to form a standing wave, which is confined in the in-plane direction of the substrate 50. The confined light receives gain in the light emitting layer 66 and undergoes laser oscillation. That is, the nanocolumn 57 causes the light generated in the light-emitting layer 66 to resonate in the in-plane direction of the substrate 50, resulting in laser oscillation. Specifically, the light generated in the light emitting layer 66 resonates in the in-plane direction of the substrate 50 in a resonant section formed by the plurality of nanocolumns 57, resulting in laser oscillation. The +1st-order diffracted light and the −1st-order diffracted light generated by the resonance then travel as laser light in the lamination direction (axis-Z direction).

The light emitted from the light emitting layers 66 resonates in the light emitting region 12R in each of the axis-X and axis-Y directions, along which the plurality of nanocolumns 57 are arranged at predetermined intervals. That is, in the present embodiment, the light emitting region 12R functions as the resonance section where the light resonates. Therefore, a distance Dx between the nanocolumns 57 located at opposite ends of the plurality of nanocolumns 57 arranged in the axis-X direction corresponds to the resonance length in the axis-X direction, and a distance Dy between the nanocolumns 57 located at opposite ends of the plurality of nanocolumns 57 arranged in the axis-Y direction corresponds to the resonance length in the axis-Y direction.

Out of the laser light that travels in the lamination direction, the laser light that travels toward the reflection layer 55 is reflected off the reflection layer 55 and travels toward the second electrodes 53. The light emitting apparatus 12 can thus emit light via the side facing the second electrodes 53.

The third semiconductor layer 58 is provided on the nanocolumns 57. The third semiconductor layer 58 is formed, for example, of a p-type GaN layer to which Mg has been doped.

The first electrode 52 is provided on the buffer layer 56 on the side facing the side surfaces of the nanocolumns 57. The first electrode 52 may be in ohmic contact with the buffer layer 56. In the example shown in FIG. 3, the first electrode 52 is electrically coupled to the first semiconductor layers 65 via the buffer layer 56. The first electrode 50 is one of the electrodes for injecting the current into the light emitting layers 66. The first electrode 52 is, for example, a laminate film in which a Ti layer, an Al layer, and an Au layer are laminated in the presented order from the side facing the buffer layer 56.

The second electrodes 53 are provided on the third semiconductor layer 58. The second electrodes 53 may be in ohmic contact with the third semiconductor layer 58. The second electrodes 53 are electrically coupled to the second semiconductor layers 67. In the example shown in FIG. 3, the second electrodes 53 are electrically coupled to the second semiconductor layers 67 via the third semiconductor layer 58. The second electrodes 53 are the other one of the electrodes for injecting the current into the light emitting layers 66. The second electrodes 53 are made, for example, of an indium tin oxide (ITO). The second electrode 53 provided at one of adjacent nanocolumns 57 is electrically coupled to the second electrode 53 provided at the other nanocolumn 57 via wiring that is not shown.

A method for manufacturing the light emitting apparatus 12 according to the present embodiment will be subsequently described.

The method for manufacturing the light emitting apparatus 12 according to the present embodiment includes the steps of forming the buffer layer 56 made of a semiconductor monocrystal at the support substrate, forming the mask layer 60 having the through holes 60a at the one surface 56a of the buffer layer 56, forming the defect dislocation prevention layers 59, which have a crystal orientation not continuous with the crystal orientation of the buffer layer 56, at the buffer layer 56 located in the through holes 60a in the mask layer 60, and forming the nanocolumns 57 by using crystal growth on the defect dislocation prevention layers 59.

FIGS. 4A to 4D show key parts of the step of manufacturing the light emitting apparatus 12. FIGS. 4A to 4D show the process of manufacturing one of the nanocolumns 57 in the step of manufacturing the light emitting apparatus 12.

Figure 4A:
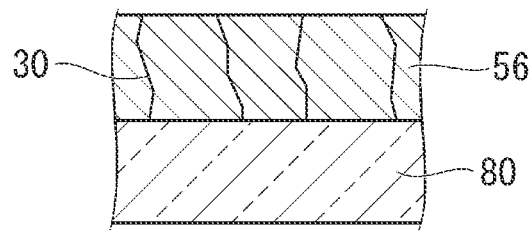
FIG. 4A shows the process of manufacturing a nanocolumn.

The step of forming the buffer layer 56 made of a semiconductor monocrystal at a support substrate 80 is first carried out, as shown in FIG. 4A. In the step described above, specifically, the buffer layer 56 is formed on the support substrate 80 by using a metal organic vapor deposition method to epitaxially grow a GaN layer. In this process, the threading dislocation defects 30 starting from the interface between the buffer layer 56 and the support substrate 80 are produced in the buffer layer 56 due, for example, to lattice mismatch and thermal expansion coefficient mismatch between the buffer layer 56 and the support substrate 80.

Figure 4B:
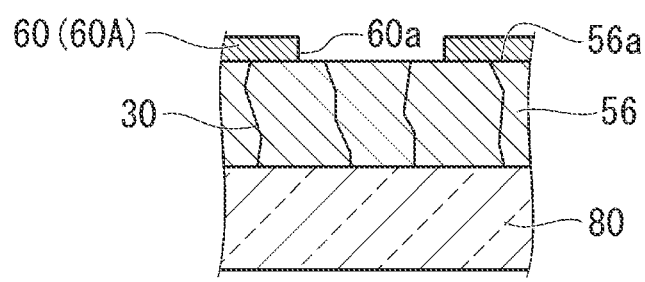
FIG. 4B shows the process of manufacturing the nanocolumn.

The step of forming the mask layer 60 having the through holes 60a at the one surface 56a of the buffer layer 56 is subsequently carried out, as shown in FIG. 4B. Specifically, a mask formation layer 60A formed, for example, of a silicon oxide layer or a silicon nitride layer is formed at the one surface 56a of the buffer layer 56. The mask layer 60 is then formed on the buffer layer 56 by using a photolithography technology in predetermined positions on the mask formation layer 60A to open the through holes 60a.

The defect dislocation prevention layers 59 having a crystal orientation not continuous with the crystal orientation of the buffer layer 56 are subsequently formed at the buffer layer 56 located in the through holes 60a in the mask layer 60, as shown in FIG. 4C. Specifically, the defect dislocation prevention layers 59 are formed by using Ar sputtering to roughen the one surface 56a of the buffer layer 56 located in the through holes 60a. That is, the defect dislocation prevention layers 59 are formed at the bottom surfaces of the through holes 60a.

The nanocolumns 57 are subsequently formed on the defect dislocation prevention layers 59 by using crystal growth, as shown in FIG. 4D. That is, the nanocolumns 57 are formed on the defect dislocation prevention layers 59 via the through holes 60a by using crystal growth. Specifically, the first semiconductor layers 65, the light emitting layers 66, and the second semiconductor layers 67 are sequentially formed on the defect dislocation prevention layers 59 by using epitaxial growth.

A case where the nanocolumns 57 are formed directly on the buffer layer 56 without formation of the defect dislocation prevention layers 59 will now be described as a manufacturing process according to Comparative Example. In the manufacturing process according to Comparative Example, the threading dislocation defects 30 are undesirably formed in the first semiconductor layers 65, which form the nanocolumns 57. When the threading dislocation defects 30 are thus formed in the first semiconductor layers 65, the threading dislocation defects 30 propagate into the light emitting layers 66 on the first semiconductor layers 65, resulting in a decrease in light emission efficiency and in turn a problem that prevents the light emitting apparatus from achieving desired light emission performance.

In contrast, in the method for manufacturing the light emitting apparatus 12 according to the present embodiment, the defect dislocation prevention layers 59 are formed between the first semiconductor layers 65 and the buffer layer 56, and then the nanocolumns 57 are formed on the defect dislocation prevention layers 59.

The defect dislocation prevention layers 59 have a crystal orientation not continuous with the crystal orientation of the buffer layer 56, as described above. Therefore, when the first semiconductor layers 65 are formed by using epitaxial growth, the threading dislocation defects 30 are blocked by the planes of crystal discontinuity provided by the defect dislocation prevention layers 59, whereby the propagation of the threading dislocation defects 30 into the first semiconductor layers 65 can be suppressed or prevented.

Since the method for manufacturing the light emitting apparatus 12 according to the present embodiment can suppress or prevent the propagation of the threading dislocation defects 30 into the first semiconductor layers 65 as described above, the threading dislocation defects 30 do not propagate into the light emitting layers 66 formed on the first semiconductor layers 65.

The method for manufacturing the light emitting apparatus 12 according to the present embodiment can therefore prevent the propagation of threading dislocation defects 30 into the light emitting layers 66 and can thus manufacture the nanocolumns 57 that provide desired light emission performance.

After the nanocolumns 57 are manufactured, the light propagation layer 63, the third semiconductor layer 58, the first electrode 52 and the second electrodes 53 are formed. The light emitting apparatus 12 according to the present embodiment can then be manufactured by peeling the support substrate 80 off the buffer layer 56 on which the nanocolumns 57 and other components are formed and attaching the buffer layer 56 to the substrate 50 via the reflection layer 55.

The timing at which the support substrate 80 is peeled off the buffer layer 56 is not limited to a specific timing. After the support substrate 80 is peeled off and the buffer layer 56 is attached to the substrate 50 via the reflection layer 55, the first electrode 52, the second electrodes 53, and other components may be formed on the buffer layer 56.

As described above, the light emitting apparatus 12 according to the present embodiment includes the buffer layer 56 made of a single crystal, the mask layer provided at the one surface 56a of the buffer layer 56, the defect dislocation prevention layers 59 provided at the buffer layer 56 so as to be located in the through holes 60a formed in the mask layer 60 and having a crystal orientation not continuous with the crystal orientation of the buffer layer 56, and the nanocolumns 57 including the light emitting layers 66 and extending from the defect dislocation prevention layers 59, and the nanocolumns 57 are disposed in positions where the nanocolumns 57 overlap with the defect dislocation prevention layers 59 in the plan view along the direction in which the nanocolumns 57 extend.

The light emitting apparatus 12 according to the present embodiment, in which the threading dislocation defects 30 present in the buffer layer 56 are blocked by the planes of crystal discontinuity produced by the defect dislocation prevention layers 59, can suppress or prevent propagation of the threading dislocation defects 30 into the light emitting layers 66, which form the nanocolumns 57. The light emitting apparatus 12 according to the present embodiment can thus suppress a decrease in light emission efficiency resulting from the propagation of threading dislocation defects 30 to efficiently illuminate the light modulation apparatus 13.

In the light emitting apparatus 12 according to the present embodiment, the thickness T of the defect dislocation prevention layers 59 may be smaller than or equal to 5 nm.

The defect dislocation prevention layers 59 can thus each be formed of a layer having a defect density level that does not affect the epitaxial growth of the nanocolumns 57 but can block the threading dislocation defects 30.

In the light emitting apparatus 12 according to the present embodiment, the defect dislocation prevention layers 59 may be provided in a position recessed from the one surface 56a of the buffer layer 56, and the depth D of the recesses 70, where the defect dislocation prevention layers 59 are provided, may range from 0 to 30 nm.

The defect dislocation prevention layers 59 can thus each be formed of a layer having a defect density level that does not affect the epitaxial growth of the nanocolumns 57 but can block the threading dislocation defects 30.

In the light emitting apparatus 12 according to the present embodiment, the defect dislocation prevention layers 59 may each be provided over the entire region of the opening of the corresponding through hole 60a.

The configuration described above allows effective blocking of the propagation of the threading dislocation defects 30 via the entire region of the opening of each of the through holes 60a.

The projector 10 according to the present embodiment includes the light emitting apparatus 12, the light modulation apparatus 13, which modulates the light emitted from the light emitting apparatus 12 in accordance with image information to generate image light, and the projection optical apparatus 14, which projects the image light outputted from the light modulation apparatus 13.

The projector 10 according to the present embodiment, which includes the light emitting apparatus 12, which provides the effects described above, has high light emission efficiency and can therefore display a bright image.

Second Embodiment

A second embodiment of the present disclosure will be subsequently described with reference to the drawings. The projector according to the present embodiment differs from the projector according to the first embodiment only in the configuration of the light emitting apparatus. The configuration of the light emitting apparatus will therefore be described below.

FIG. 5 shows the configuration of key parts of a light emitting apparatus 112 according to the present embodiment. FIG. 5 is an enlarged view showing key parts of one of the nanocolumns 57 in the light emitting apparatus 112.

In the light emitting apparatus 112 according to the present embodiment, the buffer layer 56 has air gaps 71, which are formed on the opposite (lower) side of the defect dislocation prevention layers 59 from the side where the nanocolumns 57 extend, as shown in FIG. 5. The air gaps 71 are each a void formed in the buffer layer 56.

The air gaps 71 are located below the defect dislocation prevention layers 59 in the buffer layer 56. The air gaps 71 are provided so as to be surrounded by the buffer layer 56. The air gaps 71 are manufactured, for example, by carrying out the following steps. First, openings are formed by etching in the middle of the step of forming the buffer layer 56 by using epitaxial growth. The buffer layer 56 is then epitaxially grown to surround the openings. The air gaps 71 described above are thus manufactured.

The air gaps 71 are each provided in a central portion of the corresponding through hole 60a. The diameter of the air gaps 71 is set to be smaller than the diameter of the through holes 60a. The setting described above prevents the growth of the nanocolumns 57 from being hindered by excessive growth of the air gaps 71.

The defect dislocation prevention layers 59 are each a layer in which point defects locally gather or a layer having random crystal orientations and each have an island-shaped single crystal surface, as described above. When the threading dislocation defects 30 propagate obliquely from below to above in the buffer layer 56, the threading dislocation defects 30 are blocked when hitting any of the plurality of planes of crystal orientation discontinuity contained in the defect dislocation prevention layers 59.

On the other hand, for example, when the threading dislocation defects 30 propagate relatively straight from below to above in the buffer layer 56, there is a possibility of propagation of the threading dislocation defects 30 through the single crystal planes of the defect dislocation prevention layers 59 toward the nanocolumns 57.

In contrast, in the light emitting apparatus 112 according to the present embodiment, the air gaps 71 provided below the defect dislocation prevention layers 59 in the buffer layer 56 can block the propagation of threading dislocation defects 30a toward the defect dislocation prevention layers 59 even when, for example, there is the threading dislocation defects 30a that propagate relatively straight from below to above in the buffer layer 56.

As described above, the light emitting apparatus 112 according to the present embodiment, which includes the air gaps 71 in addition to the defect dislocation prevention layers 59, can further reduce the risk of propagation of the threading dislocation defects 30 toward the nanocolumns 57. The light emitting apparatus 112 according to the present embodiment can therefore be a more reliable light emitting apparatus that suppresses a decrease in light emission efficiency resulting from the propagation of the threading dislocation defects 30 into the light emitting layers 66, which form the nanocolumns 57.

The technical scope of the present disclosure is not limited to the embodiments described above, and a variety of changes can be made thereto to the extent that the changes do not depart from the substance of the present disclosure.

For example, in the embodiments described above, the defect dislocation prevention layers 59 are provided in a position recessed from the one surface 56a of the buffer layer 56, and the defect dislocation prevention layers 59 may instead be formed so as to be flush with the one surface 56a of the buffer layer 56.

The aforementioned embodiments have been described with reference to the case where the light emitting layers are made of an InGaN-based material, and the light emitting layers can be made of any of a variety of other semiconductor materials in accordance with the wavelength of the light to be emitted from the light emitting layers. Examples of the material of the light emitting layers may include an AlGaN-based, AlGaAs-based, InGaAs-based, InGaAsP-based, InP-based, GaP-based, and AlGaP-based semiconductor materials. The diameter of the photonic crystal structures or the intervals at which the photonic crystal structures are arranged may be changed as appropriate in accordance with the wavelength of the light to be emitted from the light emitting layers.

In the embodiments described above, the photonic crystal structures are each formed of a columnar structure protruding from the substrate, and a plurality of holes may instead be provided at fixed intervals to achieve the photonic crystal effect. That is, the light emitting region only needs to contain periodic photonic crystal structures irrespective of whether the photonic crystal structures are formed of columnar structures or holes. A core-shell photonic crystal structures can still instead be employed.

In addition to the above, the specific descriptions of the shape, the number, the arrangement, the material, and other factors of each component of the light emitting apparatus and the projector are not limited to those in the embodiments described above and can be changed as appropriate. The above embodiments have been described with reference to the case where the light emitting apparatus according to the present disclosure is incorporated in a projector using a transmissive liquid crystal display device as the light modulation apparatus, but not necessarily. The light emitting apparatus according to the present disclosure may be incorporated in a projector using a reflective liquid crystal display device or a digital micromirror device as the light modulation apparatus.

The aforementioned embodiments have been described with reference to the case where the light emitting apparatus according to the present disclosure is incorporated in a projector, but not necessarily. For example, the light emitting apparatus according to the present disclosure is applicable to a micro-LED display, a head mounted display, or a smartwatch display apparatus. The light emitting apparatus according to the present disclosure can be used as a lighting apparatus, a headlight of an automobile, and other components.

A light emitting apparatus according to an aspect of the present disclosure may have the configuration below.

The light emitting apparatus according to the aspect of the present disclosure includes a first layer made of a semiconductor monocrystal, a second layer provided at the first layer and having a crystal orientation not continuous with the crystal orientation of the first layer, and a columnar crystal structure including a light emitting layer, and the columnar crystal structure extends from the second layer.

In the light emitting apparatus according to the aspect of the present disclosure, the second layer may have a thickness smaller than or equal to 5 nm.

In the light emitting apparatus according to the aspect of the present disclosure, the second layer may be provided in a position recessed from one surface of the first layer, and a recess where the second layer is provided may have a depth ranging from 0 to 30 nm.

The light emitting apparatus according to the aspect of the present disclosure may further include a mask layer provided at the one surface of the first layer and having a through hole. The columnar crystal structure may extend from the second layer through the through hole. The second layer may be provided over the entire region of the opening of the through hole.

In the light emitting apparatus according to the aspect of the present disclosure, the second layer may have one surface and another surface opposite from the first surface, and the first layer may have an air gap on the side facing the other side of the second layer.

A method for manufacturing a light emitting apparatus according to another aspect of the present disclosure may have the configuration below.

The method for manufacturing a light emitting apparatus according to the other aspect of the present disclosure includes forming a first layer made of a semiconductor monocrystal at a support substrate, forming a mask layer having a through hole at one surface of the first layer, forming a second layer having a crystal orientation not continuous with the crystal orientation of the first layer at the first layer located in the through hole, and forming a columnar crystal structure including a light emitting layer on the second layer by using crystal growth.

In the method for manufacturing a light emitting apparatus according to the other aspect of the present disclosure, in the formation of the second layer, the formed second layer may have a thickness smaller than or equal to 5 nm.

In the method for manufacturing a light emitting apparatus according to the other aspect of the present disclosure, in the formation of the second layer, the second layer may be provided in a position recessed from the one surface of the first layer, and a recess where the second layer is formed may have a depth ranging from 0 to 30 nm.

In the method for manufacturing a light emitting apparatus according to the other aspect of the present disclosure, in the formation of the second layer, the second layer may be provided over the entire region of the opening of the through hole.

In the method for manufacturing a light emitting apparatus according to the other aspect of the present disclosure, in the formation of the first layer, an air gap may be formed in the first layer, and in the formation of the second layer, the second layer may be formed above the air gap.

A projector according to another aspect of the present disclosure may have the configuration below.

The projector according to the other aspect of the present disclosure includes the light emitting apparatus according to the aspect of the present disclosure, a light modulation apparatus that modulates light emitted from the light emitting apparatus in accordance with image information to generate image light, and a projection optical apparatus that projects the image light outputted from the light modulation apparatus.

What is claimed is:

1. A light emitting apparatus comprising:
a first layer made of a semiconductor monocrystal;
a second layer provided at the first layer and having a crystal orientation not continuous with a crystal orientation of the first layer; and
a columnar crystal structure including a light emitting layer and extending from the second layer,
wherein the second layer is provided in a position recessed from one surface of the first layer, and
a recess where the second layer is provided has a depth ranging from 0 to 30 nm.

2. The light emitting apparatus according to claim 1, wherein the second layer has a thickness smaller than or equal to 5 nm.

3. The light emitting apparatus according to claim 1, further comprising a mask layer provided at the one surface of the first layer and having a through hole,
wherein the columnar crystal structure extends from the second layer through the through hole, and
the second layer is provided over an entire region of an opening of the through hole.

4. The light emitting apparatus according to claim 1, wherein the first layer has an air gap formed on an opposite side of the second layer from a side where the columnar structure extends.

5. A projector comprising:
the light emitting apparatus according to claim 1;
a light modulation apparatus that modulates light emitted from the light emitting apparatus in accordance with image information to generate image light; and
a projection optical apparatus that projects the image light outputted from the light modulation apparatus.

6. A method for manufacturing a light emitting apparatus, the method comprising:
forming a first layer made of a semiconductor monocrystal at a support substrate;
forming a mask layer having a through hole at one surface of the first layer;
forming a second layer having a crystal orientation not continuous with a crystal orientation of the first layer at the first layer located in the through hole; and
forming a columnar crystal structure including a light emitting layer on the second layer by using crystal growth,
wherein in the formation of the second layer,
the second layer is provided in a position recessed from the one surface of the first layer, and
a recess where the second layer is formed has a depth ranging from 0 to 30 nm.

7. The method for manufacturing a light emitting apparatus according to claim 6,
wherein in the formation of the second layer,
the formed second layer has a thickness smaller than or equal to 5 nm.

8. The method for manufacturing a light emitting apparatus according to claim 6,
wherein in the formation of the second layer,
the second layer is provided over an entire region of an opening of the through hole.

9. The method for manufacturing a light emitting apparatus according to claim 6,
wherein in the formation of the first layer, an air gap is formed in the first layer, and
in the formation of the second layer, the second layer is formed above the air gap.

10. A light emitting apparatus comprising:
a first layer made of a semiconductor monocrystal;
a mask layer provided at one surface of the first layer and having a through hole;
a second layer provided at the first layer and over an entire region of an opening of the through hole of the mask layer, the second layer having a crystal orientation not continuous with a crystal orientation of the first layer; and
a columnar crystal structure including a light emitting layer and extending from the second layer through the through hole.

11. The light emitting apparatus according to claim 10, wherein the second layer has a thickness smaller than or equal to 5 nm.

12. The light emitting apparatus according to claim 10, wherein the second layer is provided in a position recessed from the one surface of the first layer, and
a recess where the second layer is provided has a depth ranging from 0 to 30 nm.

13. The light emitting apparatus according to claim 10, wherein the first layer has an air gap formed on an opposite side of the second layer from a side where the columnar structure extends.

* * * * *